(12) United States Patent
Heissmeier et al.

(10) Patent No.: US 6,680,151 B2
(45) Date of Patent: Jan. 20, 2004

(54) ALTERNATING PHASE MASK

(75) Inventors: Michael Heissmeier, München (DE);
Markus Hofsäss, München (DE);
Burkhard Ludwig, München (DE);
Molela Moukara, München (DE);
Christoph Nölscher, Nürnberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/174,646

(22) Filed: Jun. 18, 2002

(65) Prior Publication Data

US 2002/0192574 A1 Dec. 19, 2002

(30) Foreign Application Priority Data

Jun. 18, 2001 (DE) .......................... 101 29 202

(51) Int. Cl.[7] .............................. G03F 9/00; G06F 17/50
(52) U.S. Cl. ............................................. 430/5; 716/21
(58) Field of Search ............................ 430/5, 322, 323, 430/324; 716/19, 20, 21

(56) References Cited

U.S. PATENT DOCUMENTS 6,524,752 B1 * 2/2003 Pierrat ........................... 430/5

FOREIGN PATENT DOCUMENTS

DE 199 57 542 A1 7/2001
DE 100 51 134 A1 5/2002

OTHER PUBLICATIONS

Marc D. Levenson et al.: "Improving Resolution in Photolithography with a Phase–Shifting Mask", *IEEE Transactions on Electron Devices*, vol. ED–29, No. 12, 1982, pp. 1828–1836.
D. Widmann et al.: "Technologie hochintegrierter Schaltungen", [technology of highly integrated circuits], *Springer Verlag, Berlin*, 2$^{nd}$ . ed., pp. 135–139, as mentioned on p. 2 of the specification.

* cited by examiner

*Primary Examiner*—S. Rosasco
(74) *Attorney, Agent, or Firm*—Laurence A. Greenberg; Werner H. Stemer; Gregory L. Mayback

(57) ABSTRACT

An alternating phase mask is described in which a propagation of a T phase conflict which occurs in the case of a T pattern structure is avoided by producing a phase jump at one of the 90° corners of the T pattern structure. First and second transparent area segments, which produce a mutual phase difference of 180°, are separated by a narrow slot running approximately at 45° toward the corner of the T pattern structure. The structure containing the transparent area segments, which are separated by the slot running at 45°, can also be provided at the other corner of the T structure providing a solution for each T conflict. The trimming mask for eliminating the dark line artificially produced by the 180° phase jump is a conventional mask and requires no additional coloration. Moreover, alignment errors are minimal on account of the small number of trimming openings.

7 Claims, 3 Drawing Sheets

ALTERNATING PHASE MASK

BACKGROUND OF THE INVENTION

Field of the Invention

The invention relates to an alternating phase mask for the exposure of a photosensitive layer in a photolithography process, in particular in the fabrication of large scale integrated semiconductor circuits. The phase mask has at least one T pattern structure that has at least one first and second opaque segment. The second opaque segment joins a longitudinal side of the first opaque segment and subdivides the latter into two opaque partial segments on both sides of a joining point. The phase mask has first and second transparent area segments in an alternating sequence on both sides of the partial segments of the first opaque segment and of the second opaque segment, which area segments impart a mutual phase shift by 180° on an exposure radiation passing through them.

An alternating phase mask is disclosed for example in Published, Non-Prosecuted German Patent Application DE 199 57 542 A1, by this applicant and commonly assigned, and corresponding to U.S. patent application Ser. No. 10/158,733.

In the fabrication of integrated semiconductor circuits, mask structures assigned to the circuit elements are optically imaged in a conventional manner in light-sensitive layers on the wafer. On account of the diffraction effects, the resolution of such an imaging system is limited, and mask structures with dimensions below the reciprocal value of the resolution, the so-called critical structures, are imaged in a blurred or unsharp manner. This leads to undesirable strong correlations between the circuit elements and thus to impairment of the circuit functionality.

These difficulties can be overcome by utilizing the destructive interference effect of two closely adjacent coherent or partly coherent light beams that are phase-shifted by 180° relative to one another. To that end, the conventional masks affected are converted into alternating phase masks in which each critical structure is provided with two-phase shifters for producing the required phase shift.

The various types of phase masks are described for example in the book titled "Technologie hochintegrierter Schaltungen" [Technology of large scale integrated circuits] by D. Widmann, H. Mader and H. Friedrich, 2nd edition, Springer-Verlag, page 135 et seq. Furthermore, an extensive overview of phase mask technology is contained in the publication titled "Improving Resolution in Photolithography with a Phase-Shifting Mask" by M. D. Levenson et al. in IEEE Transactions on Electron Devices 29 (1982), 1828 ff.

The use of so-called strong phase masks, which include both the alternating phase masks already mentioned and chromium-free phase masks, requires the transparent phase-shifting structures in each affected plane to be allocated to one of two phases which have a mutual phase difference of approximately 180°.

In view of the complexity of modern circuits and the requirement for two elements that affect a respective phase jump by 180° on each critical structure, phase conflicts are unavoidable, however. A phase conflict is present precisely when the same phase is incorrectly allocated to the phase shifters on both sides of a critical structure, or when, on account of the interaction of the phase-shifting elements, the destructive interference effect occurs at an undesired point on the aforementioned light-sensitive layer.

For this problem, Published, Non-Prosecuted German Patent Application DE 100 51 134 A1 by this applicant and commonly assigned, corresponding to U.S. patent application Ser. No. 09/978,396 now U.S. Pat. No. 6,543,045, proposes an automatically proceeding method for ascertaining possible phase conflicts on alternating phase masks and for automatically eliminating the phase conflicts.

In principle, two different methods exist for resolving a phase conflict in alternating phase mask technology. One method requires the distortion of the layout in order to eliminate lithographically critical structures. However, this method is to be avoided, if possible, because it does not accord with the miniaturization process of microelectronics as controlled by Moore's law. The second currently preferred method for resolving phase conflicts, as is disclosed in the aforementioned Published, Non-Prosecuted German Patent Application DE 100 51 134 A1 by the same applicant, consists in the artificial production of phase jumps at optimal points in the layout, so that a two-colorable set of phase shifters is produced. The phase jumps lead to dark lines on the photosensitive layer on the wafer. The dark lines are usually eliminated by a further exposure operation using a so-called trimming mask. If at least two-phase jumps are required for resolving a phase conflict, then the phase conflict is referred to as propagating.

Published, Non-Prosecuted German Patent Application DE 199 57 542 mentioned in the introduction, proposes an alternating phase mask. However, the alternating phase mask requires a trimming mask that is an alternating phase mask, that is to say requires an additional coloration.

SUMMARY OF THE INVENTION

It is accordingly an object of the invention to provide an alternating phase mask that overcomes the above-mentioned disadvantages of the prior art devices of this general type, in which a double exposure technique is made available for the efficient handling of propagating T conflicts in the alternating phase mask technology.

With the foregoing and other objects in view there is provided, in accordance with the invention, an alternating phase mask for an exposure of a photosensitive layer in a photolithography process, in particular for fabricating large scale integrated semiconductor circuits. The alternating phase mask contains at least one T pattern structure having at least one first opaque segment with a longitudinal side and at least one second opaque segment. The second opaque segment joins the longitudinal side of the first opaque segment at a joining point and subdivides the first opaque segment into two opaque partial segments on both sides of the joining point. Transparent area segments, including first transparent area segments and second transparent area segments, are disposed in an alternating sequence on both sides of the two opaque partial segments of the first opaque segment and of the second opaque segment. The transparent area segments impart a mutual phase shift by 180° on exposure radiation passing through the transparent area segments. The T pattern structure has corners and at one of the corners where the second opaque segment meets the first opaque segment, one of the first transparent area segments and one of the second transparent area segments are disposed such that the exposure radiation passing through them experiences a phase jump by 180° there, a point producing the phase jump forming an angle with each of two affected sections of the first and second opaque area segments, and the angle substantially bisects a corner angle of the T pattern structure.

In the alternating phase mask according to the invention, the T conflict is resolved by producing a phase jump at one of the 90° corners of the T structure. The phase jump forms an angle of 45° with each of the two affected sections of the T-shaped structure considered. That is to say there are two equivalent solutions for each T conflict.

A major advantage is that the trimming mask for the alternating phase mask proposed, for eliminating the dark lines which remain during the first exposure operation with the alternating phase mask, is a conventional mask and consequently requires no additional coloration, in contrast to the propagation technique. A further advantage is a minimal alignment error, because the number of trimming openings is greatly reduced.

The alternating phase mask technology according to the invention can be applied to all known alternating phase masks, in particular to the alternating bright-field and dark-field phase masks.

In accordance with an added feature of the invention, two affected sections of the first and second transparent area segments are spaced apart from one another by a slot formed therebetween, and the slot separates the two affected sections of the first and second transparent area segments and forms the angle with respect to the corner of the T pattern structure.

In accordance with a further feature of the invention, a distance between the two affected sections of the first and second transparent area segments, is formed by the slot, and the slot is significantly smaller than a width of each of the two affected sections of the first and second transparent area segments. Ideally, the distance approaches zero. In other words, the distance is extremely small compared to the width of the transparent area segments.

In accordance with an additional feature of the invention, the first opaque segment and the second opaque segment of the T pattern structure have are elongated rectangular webs and meet one another at the joining point at an angle of about 90°.

In accordance with another feature of the invention, the transparent area segments in each case have a substantially rectangular shape and the two affected sections of the first and second transparent area segments form, at the slot, an end edge that runs in a manner inclined by the angle.

In accordance with another added feature of the invention, the angle is approximately equal to 45°.

With the foregoing and other objects in view there is provided, in accordance with the invention, a combination of the alternating phase mask described above, and a trimming mask for a second exposure operation following a first exposure operation with the alternating phase mask. The trimming mask contains an opaque area region encompassing the T pattern structure with the first and second opaque segments and the transparent area segments. The opaque area region has a cutout formed therein lying in a direction and at a location of the slot of the alternating phase mask and encompasses the slot. A transparent area region fills the cutout and surrounds the opaque area region.

Other features which are considered as characteristic for the invention are set forth in the appended claims.

Although the invention is illustrated and described herein as embodied in an alternating phase mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
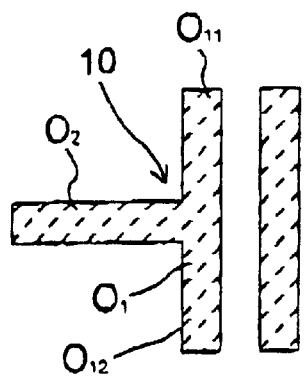
FIG. 1A is a diagrammatic, sectional view of a layout which leads to a local T conflict.

Referring now to the figures of the drawing in detail and first; particularly, to FIG. 1A thereof, there is shown one type of a phase conflict, a so-called T phase conflict, that is established at T-shaped branchings of pattern structures of an alternating phase mask. FIG. 1A diagrammatically shows a layout from bright-field mask technology with such a critical T pattern structure 10. In the case of the T pattern structure 10, a second opaque segment $O_2$ joins a longitudinal side of a first opaque segment $O_1$ and in this way subdivides the first opaque segment $O_1$ into two opaque partial segments $O_{11}$, $O_{12}$ on both sides of a joining point.

Figure 1B:
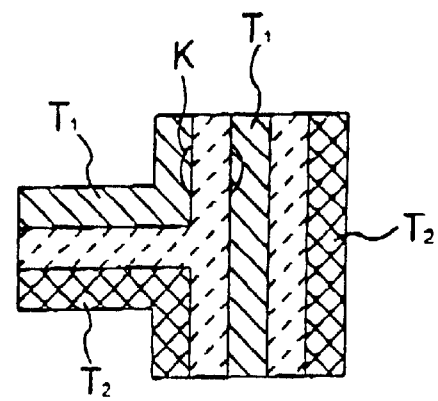
FIG. 1B is a sectional view of an alternating phase mask which is used to illustrate the T phase conflict.

FIG. 1B shows an alternating phase mask which is associated with the T pattern structure of FIG. 1A and, due to the local T conflict, indicated by a circle K in FIG. 1B, has a non-two-colorable set of phase shifters.

Figure 1C:
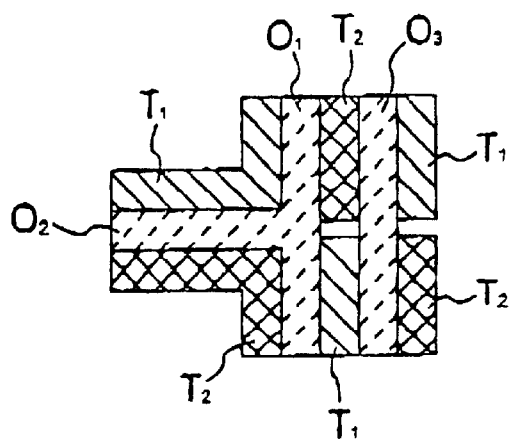
FIG. 1C is a sectional view showing the alternating phase mask with a propagating resolution of a phase conflict that occurs.

FIG. 1C illustrates the propagating resolution of the T conflict. FIG. 1C clearly shows that the resolution of the phase conflict necessitates two-phase jumps in each case between $T_1$ and $T_2$ (therefore the phase conflict is propagating). The continuously obliquely broken-lined hatched opaque segments of the alternating phase masks in accordance with FIGS. 1B and 1C are chromium segments, for example. The obliquely hatched first transparent area segments $T_1$ impart a phase angle φ, for example, on an exposure radiation passing through them, and the cross-hatched second transparent area segments $T_2$ impact a phase angle of φ+180° on an exposure radiation passing through them.

Figure 3A:
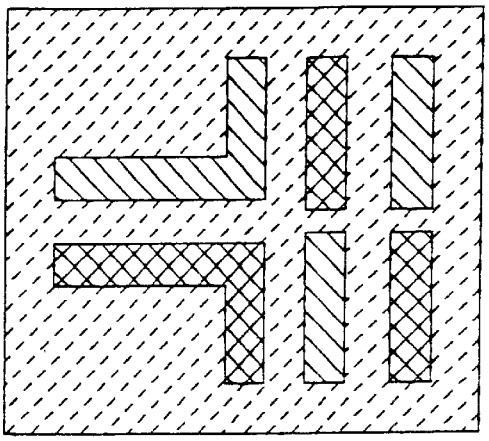
FIGS. 3A and 3B are sectional views showing respectively the alternating phase mask for the first exposure step and a trimming mask for the propagating conflict resolution.
Figure 3B:
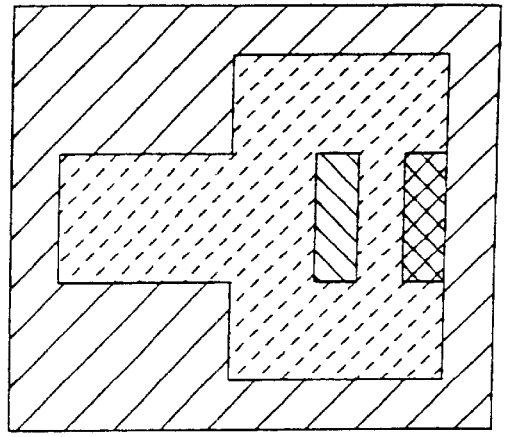

FIG. 3A shows an alternating phase mask for the propagating conflict resolution in accordance with FIG. 1C, while FIG. 3B shows a trimming mask adapted to the alternating phase mask in accordance with FIG. 3A. The outermost continuously obliquely hatched area region of FIG. 3B is chosen such that it imparts on the exposure radiation passing through an average phase shift which lies approximately in the middle between the phase φ and the phase φ+180°. The broken-lined obliquely hatched area region is again a chromium region, while the two inner obliquely and cross hatched regions are segments of an alternating phase mask, which results in that the trimming mask shown in FIG. 3B requires an additional coloration.

Figure 1D:
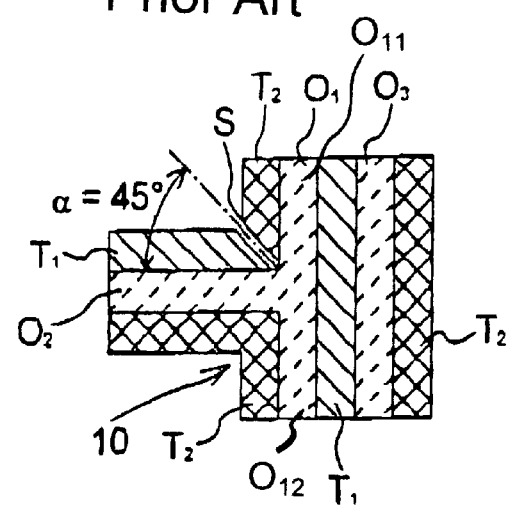
FIG. 1D is a sectional view showing the alternating phase mask according to the invention with one of two possible resolutions.

FIG. 1D shows an alternating phase mask according to the invention and is used for the aforementioned first exposure step. The T pattern structure 10 is shown in an obliquely broken-lines hatched manner, which structure 10 has already been explained in FIG. 1A and has at least one first and second opaque segment $O_1$ and $O_2$. The second opaque segment $O_2$ joins the longitudinal side of the first opaque segment $O_1$ and subdivides the latter into the two opaque partial segments $O_{11}$, $O_{12}$ on both sides of the joining point.

The transparent area segments $T_1$ and $T_2$ (respectively continuously obliquely and crosswise hatched) are provided in such a way that, at one of the corners of the T pattern structure 10, where the second opaque segment $O_2$ joins the first opaque segment $O_1$, they produce a phase jump of 180° between the first transparent area segment $T_1$ provided at this point and the second transparent area segment $T_2$, which lies at a right angle with respect thereto on the adjoining T bar section. The two transparent area segments $T_1$ and $T_2$ do not touch one another, but rather are spaced apart by a slot S provided there at an angle α=45°. A width of the slot S is very much smaller than the width of the transparent first and second area segments $T_1$ and $T_2$ there and may tend toward zero. In FIG. 1D, the slot S bisects the 90° angle between the first and second opaque segments $O_1$, $O_2$. The angle α may, of course, deviate from 45° if the opaque segments $O_1$ and $O_2$ of the T structure 10 do not meet one another at a right angle.

It should be noted that the electrode according to the invention, as illustrated in FIG. 1D, for resolving each T conflict has two equivalent solutions. Instead of producing the 180° phase jump in the corner illustrated in FIG. 1D, it is equally possible to choose the opposite corner. In FIG. 1D, provision is additionally made of a first transparent area segment $T_1$ on the other side of the first opaque segment $O_1$ that is to say opposite the second opaque segment $O_2$, and of a second transparent area segment $T_2$ at the other corner region of the T pattern structure 10. A further second transparent area segment $T_2$ bears on a further opaque segment $O_3$.

Figure 2A:
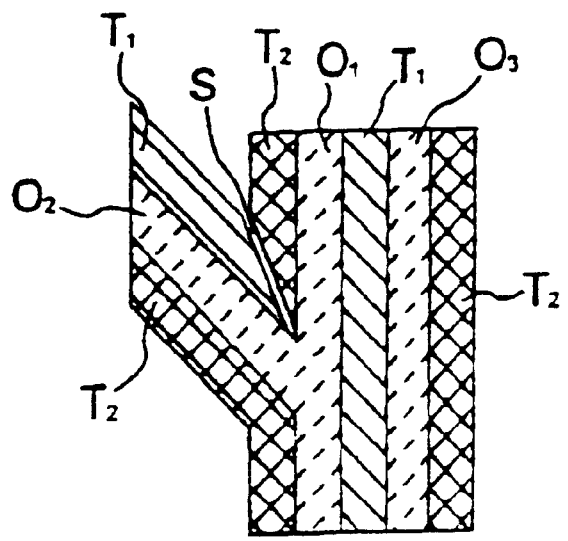
FIGS. 2A and 2B are sectional views showing further forms of alternating phase masks according to the invention with which the phase conflict is resolved by producing a phase jump at at least one corner.
Figure 2B:
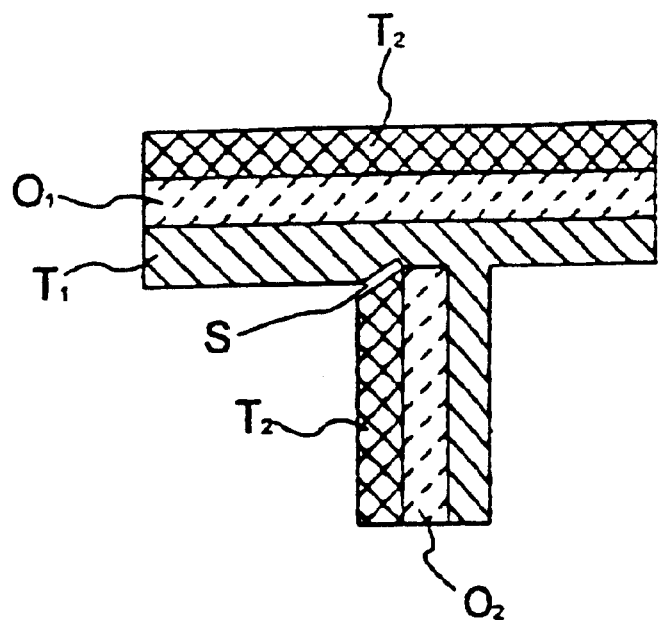

FIGS. 2A and 2B show further forms of alternating phase masks according to the invention with which a T phase conflict is resolved in the case of differently formed T pattern structures.

In FIG. 2A, the T pattern structure is not right-angled. Thus, the slot S at one of the corners does not run at 45°, but rather divides the angle there which is formed by the first opaque segment $O_1$ and the second opaque segment $O_2$. As mentioned, in an equivalent solution, the slot S could divide a first and second transparent area segment from the other corner region while forming the 180° phase jump proposed. For the rest, the structure of an alternating phase mask as illustrated in FIG. 2B is identical to the alternating phase mask in accordance with FIG. 1D.

FIG. 2B illustrates that the solution according to the invention can also be applied to an apparent T conflict. In FIG. 2B, the first opaque segment $O_1$ forms a straight first web, while a second opaque segment $O_2$ is approximately perpendicular to the first opaque segment $O_1$ but does not join the latter. By providing the slot S at a corner between the first transparent area segments $T_1$ and one of the second transparent area segments $T_2$, lying on one side of the second opaque segment $O_2$, it is possible to produce a phase jump of 180° there according to the invention.

Figure 3C:
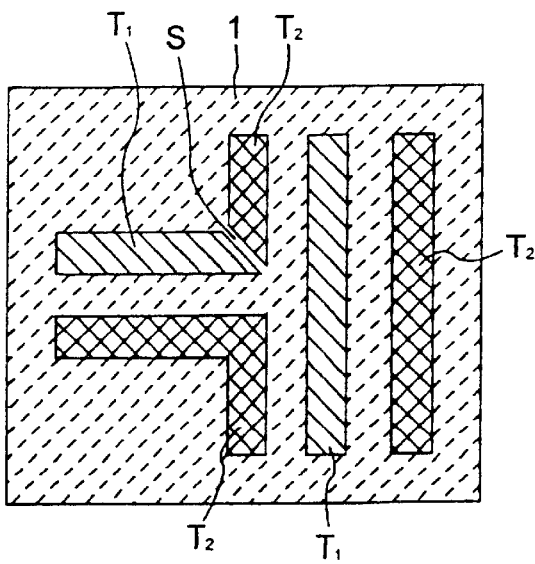
FIG. 3C is a sectional view showing the alternating phase mask according to the invention which is configured in a similar manner to the phase mask shown in FIG. 1D.

FIG. 3C diagrammatically shows an alternating phase mask 1 according to the invention, which phase mask is a derived alternating phase mask according to the invention corresponding to FIG. 1A or 1D. The continuously obliquely and cross-hatched regions are respectively the first and second transparent area segments $T_1$ and $T_2$, which are configured in such a way that they impart a phase difference of 180° on the exposure radiation passing through. The broken-line obliquely hatched area region including the slot S is an opaque region, for example a chromium region, in the example of the bright-field phase mask technique chosen.

Figure 3D:
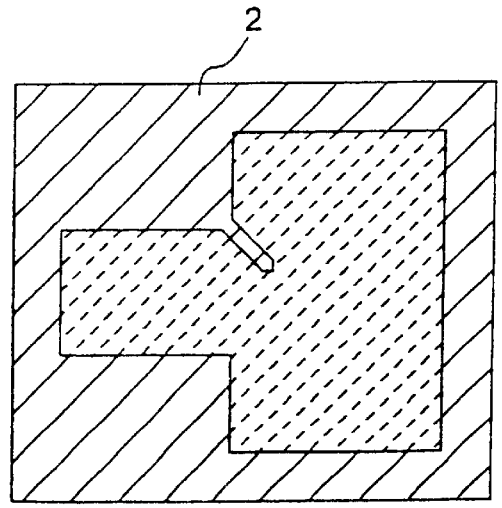
FIG. 3D is a sectional view showing the trimming mask which, in order to realize the double exposure, is adapted to the alternating phase mask shown in FIG. 3C.

FIG. 3D shows a trimming mask 2 adapted to the alternating phase mask according to the invention as shown in FIG. 3C, which trimming mask 2 is required for a second exposure for illuminating a dark line caused by the slot S. The trimming mask 2 is a conventional mask and consequently requires no additional coloration, in contrast to the trimming mask in accordance with FIG. 3B as mentioned in the introduction, which is used for the propagating conflict resolution and is an alternating phase mask and requires an additional coloration. The broken-lined obliquely hatched area region of the trimming mask 2, which omits the slot region, is an opaque region, for example a chromium region, in the bright-field phase mask technique chosen as an example. The outer continuously obliquely hatched region of the trimming mask 2 is a transparent region.

It should be noted that the trimming mask 2 used in FIG. 3D for the trimming operation, that is to say for erasing the dark line caused by the slot S of the alternating phase mask in accordance with FIG. 3C, requires no additional coloration and can therefore be fabricated without a high outlay since the number of openings is minimal. As a result, the alignment error is also minimal.

Using an optical simulator, the inventors have examined the proposed solution of an alternating phase mask according to the invention which avoids a propagating phase conflict with results having been established which corresponded very precisely to simulation results of alternating phase masks for propagating resolution. The beneficial advantage of the invention is that the propagation of the T conflicts that occur is avoided in an effective manner. Advantageously, the trimming mask need not be additionally colored, and the outlay for its fabrication and also the alignment error are minimal.

We claim:

1. An alternating phase mask for an exposure of a photosensitive layer in a photolithography process, the alternating phase mask comprising:

at least one T pattern structure having at least one first opaque segment with a longitudinal side and at least one second opaque segment, said second opaque segment joining said longitudinal side of said first opaque segment at a joining point and subdividing said first opaque segment into two opaque partial segments on both sides of said joining point; and transparent area segments, including first transparent area segments and second transparent area segments, disposed in an alternating sequence on both sides of said two opaque partial segments of said first opaque segment and of said second opaque segment, said transparent area segments imparting a mutual phase shift by 180° on exposure radiation passing through said transparent area segments;

said T pattern structure having corners and at one of said corners where said second opaque segment meets said first opaque segment, one of said first transparent area segments and one of said second transparent area segments disposed such that the exposure radiation passing through them experiences a phase jump by 180° there, a point producing the phase jump forming an angle with each of two affected sections of said first and second opaque area segments, and said angle substantially bisecting a corner angle of said T pattern structure;

said two affected sections of said first and second transparent area segments being spaced apart from one another by a slot formed therebetween being significantly smaller than a width of each of said two affected sections of said first and second transparent area segments, and said slot separating said two affected sections of said first and second transparent area segments and forming said angle with respect to said corner of said T pattern structure.

2. The alternating phase mask according to claim 1, wherein said distance approaches zero.

3. The alternating phase mask according to claim 1, wherein said first opaque segment and said second opaque segment of said T pattern structure substantially have a form of elongated rectangular webs and meet one another at said joining point at an angle of about 90°.

4. The alternating phase mask according to claim 1, wherein said transparent area segments in each case have a substantially rectangular shape and said two affected sections of said first and second transparent area segments form, at said slot, an end edge which runs in a manner inclined by said angle.

5. The alternating phase mask according to claim 1, wherein said angle is approximately equal to 45°.

6. The alternating phase mask according to claim 1, wherein the alternating phase mark is used for fabricating large scale integrated semiconductor circuits.

7. In combination with an alternating phase mask according to claim 1, a trimming mask for a second exposure operation following a first exposure operation with the alternating phase mask, the trimming mask comprising:

an opaque area region encompassing the T pattern structure with the first and second opaque segments and the transparent area segments, said opaque area region having a cutout formed therein lying in a direction and at a location of the slot of the alternating phase mask and encompasses the slot; and a transparent area region filling said cutout and surrounds said opaque area region.

* * * * *